United States Patent
Angelini et al.

(10) Patent No.: US 9,389,256 B2
(45) Date of Patent: *Jul. 12, 2016

(54) HIGH SIGNAL TO NOISE RATIO CAPACITIVE SENSING ANALOG FRONT-END

(71) Applicants: STMicroelectronics Asia Pacific Pte. Ltd., Singapore (SG); STMicroelectronics S.r.l., Agrate Brianza (IT)

(72) Inventors: Paolo Angelini, Bologna (IT); Giovanni Carlo Tripoli, Milan (IT); Ernesto Lasalandra, San Donato Milanese (IT); Tommaso Ungaretti, Pavia (IT); Kien Beng Tan, Singapore (SG); Yannick Guedon, Mimosa Park (SG); Dianbo Guo, Singapore (SG); Sze-Kwang Tan, Singapore (SG)

(73) Assignees: STMicroelectronics Asia Pacific Pte Ltd, Singapore (SG); STMicroelectronics S.r.l., Agrate Brianza (MI) (IT)

( * ) Notice: Subject to any disclaimer, the term of this patent is extended or adjusted under 35 U.S.C. 154(b) by 440 days.

This patent is subject to a terminal disclaimer.

(21) Appl. No.: 13/717,780

(22) Filed: Dec. 18, 2012

(65) Prior Publication Data

US 2014/0077823 A1 Mar. 20, 2014

Related U.S. Application Data

(63) Continuation-in-part of application No. 13/619,328, filed on Sep. 14, 2012.

(51) Int. Cl.
| | | |
|---|---|---|
| G06F 3/044 | (2006.01) | |
| G01R 27/26 | (2006.01) | |
| G06F 3/041 | (2006.01) | |

(52) U.S. Cl.
CPC ............ G01R 27/2605 (2013.01); G06F 3/044 (2013.01); G06F 3/0418 (2013.01)

(58) Field of Classification Search
CPC .... G01R 27/2605; G01R 27/26; G06F 3/044; G06F 3/045
USPC ........................................................ 345/174
See application file for complete search history.

(56) References Cited

U.S. PATENT DOCUMENTS 5,373,295 A * 12/1994 Michon ................. H03M 1/123
 341/155
5,889,511 A 3/1999 Ong et al.
(Continued)

*Primary Examiner* — Fred Tzeng
(74) *Attorney, Agent, or Firm* — Gardere Wynne Sewell LLP

(57) ABSTRACT

Capacitance sensing circuits and methods are provided. The capacitance sensing circuit includes a capacitance-to-voltage converter configured to receive a signal from a capacitance to be sensed and to provide an output signal representative of the capacitance, an output chopper configured to convert the output signal of the capacitance-to-voltage converter to a sensed voltage representative of the capacitance to be sensed, an analog accumulator configured to accumulate sensed voltages during an accumulation period of NA sensing cycles and to provide an accumulated analog value, an amplifier configured to amplify the accumulated analog value, and an analog-to-digital converter configured to convert the amplified accumulated analog value to a digital value representative of the capacitance to be sensed. The analog accumulator may include a low pass filter having a frequency response to filter wideband noise.

30 Claims, 9 Drawing Sheets

(56) References Cited

U.S. PATENT DOCUMENTS

| | | | |
|---|---|---|---|
| 5,995,084 A | 11/1999 | Chan et al. | |
| 7,454,967 B2* | 11/2008 | Skurnik | B60C 23/0408 |
| | | | 341/144 |
| 7,863,941 B1* | 1/2011 | Nguyen | G11C 7/065 |
| | | | 327/55 |
| 8,390,361 B2 | 3/2013 | Ningrat | |
| 8,547,114 B2 | 10/2013 | Kremin | |
| 9,128,573 B2* | 9/2015 | Angelini | G06F 3/044 |
| 2010/0328262 A1 | 12/2010 | Huang et al. | |
| 2011/0261005 A1 | 10/2011 | Joharapurkar et al. | |
| 2012/0218222 A1 | 8/2012 | Shen et al. | |
| 2012/0326734 A1 | 12/2012 | Cho et al. | |
| 2013/0015867 A1 | 1/2013 | Aras et al. | |

\* cited by examiner

HIGH SIGNAL TO NOISE RATIO CAPACITIVE SENSING ANALOG FRONT-END

CROSS REFERENCE TO RELATED APPLICATION

This application is a continuation-in-part of U.S. application Ser. No. 13/619,328 filed Sep. 14, 2012, which is hereby incorporated by reference in its entirety.

FIELD OF THE INVENTION

This invention relates to capacitance sensing and, more particularly, to high SNR capacitive sensing circuitry, which may be used with a touch screen, but is not limited to such use.

BACKGROUND

A touch screen is a device that can detect an object in contact with or in proximity to a display area. The display area can be covered with a touch-sensitive matrix that can detect a user's touch by way of a finger or stylus, for example. Touch screens are used in various applications such as mobile phones and other mobile devices. A touch screen may enable various types of user input, such as touch selection of items on the screen or alphanumeric input via a displayed virtual keypad. Touch screens can measure various parameters of the user's touch, such as the location, duration, etc.

One type of touch screen is a capacitive touch screen. A capacitive touch screen may include a matrix of conductive lines and columns overlaid on the display area. In mutual capacitance sensors, the capacitance between each line and column of the matrix may be sensed. A change in capacitance between a line and a column may indicate that an object, such as a finger, is touching the screen or is in proximity to the screen near the region of intersection of the line and column.

Mutual capacitance sensing circuits employ a "forcing" signal applied to a column conductor of the capacitive touch matrix and sensing of the coupled signal on respective line conductors. Since the capacitance change caused by a finger is small, on the order of 50~100 fF (typically 5% of Cs=1~2 pF), noise reduction is important in achieving satisfactory operation. There are two main sources of noise, including intrinsic noise generated by the electronics and external noise injected from the environment. In order to achieve a high signal-to-noise ratio (SNR), both sources of noise must be taken into account.

One known architecture uses a capacitance-to-voltage converter followed by a unity gain low pass filter and an analog-to-digital converter. During each cycle of operation, a forcing signal is applied to the capacitor to be sensed, and charge stored in the capacitor is converted to voltage by the capacitance-to-voltage converter. The low pass filter provides noise filtering, and two analog-to-digital conversions are performed on each cycle to provide information about the noise and the signal plus noise. It can be shown that the resolution of the system is limited by the magnitude of the signal at the output of the low pass filter in relation to a quantization error of the analog-to-digital converter. With this arrangement, there is a conflict at the output of the low pass filter between the magnitude of the signal, which is minimized to provide headroom for external noise, and the level of white noise which should be greater than 1.5 LSB of the analog-to-digital converter. Accordingly, there is a need for improved capacitance sensing circuitry.

SUMMARY OF THE INVENTION

According to embodiments of the invention, the processing of the noise is performed in the analog domain. The noise is accumulated and filtered, while the signal is accumulated and amplified. Using this approach, the signal-to-noise ratio at the output of the analog accumulator is enhanced compared to the signal-to-noise ratio at the output of the capacitance-to-voltage converter. Therefore, the swing of the signal is maximized at the input of the analog-to-digital converter. After a number of cycles of analog accumulation, an analog-to-digital conversion is performed and the signal-to-noise ratio is primarily limited by the noise performance of the analog circuitry.

In one aspect of the invention, a capacitance sensing circuit is provided. The capacitance sensing circuit comprises a capacitance-to-voltage converter configured to receive a signal from a capacitor having a capacitance to be sensed and to provide an output signal representative of a capacitance of the capacitor that is sensed, an output chopper configured to convert the output signal of the capacitance-to-voltage converter to a sensed voltage representative of the capacitor to be sensed, an analog accumulator configured to accumulate sensed voltages during an accumulation period of NA sensing cycles and to provide an accumulated analog value, an amplifier configured to amplify the accumulated analog value, and an analog-to-digital converter configured to convert the amplified accumulated analog value to a digital value representative of the sensed capacitance. In some embodiments, the analog accumulator includes a low pass filter having a frequency response to filter wideband noise.

In another aspect of the invention, a method for sensing capacitance is provided. The method comprises generating a signal representative of a capacitance of a capacitor to be sensed, converting the generated signal to a sensed voltage representative of the capacitance, repeating the generating and the converting voltages during an accumulation period of NA sensing cycles and accumulating the sensed voltages to provide an accumulated analog value, amplifying the accumulated analog value, and converting the amplified accumulated analog value to a digital value representative of the capacitance to be sensed. In some embodiments, accumulating the sensed voltages further comprises low pass filtering of the sensed voltages.

BRIEF DESCRIPTION OF DRAWINGS

For a better understanding of the present invention, reference is made to the accompanying drawings, which are incorporated herein by reference and in which.

DETAILED DESCRIPTION

Figure 1A:
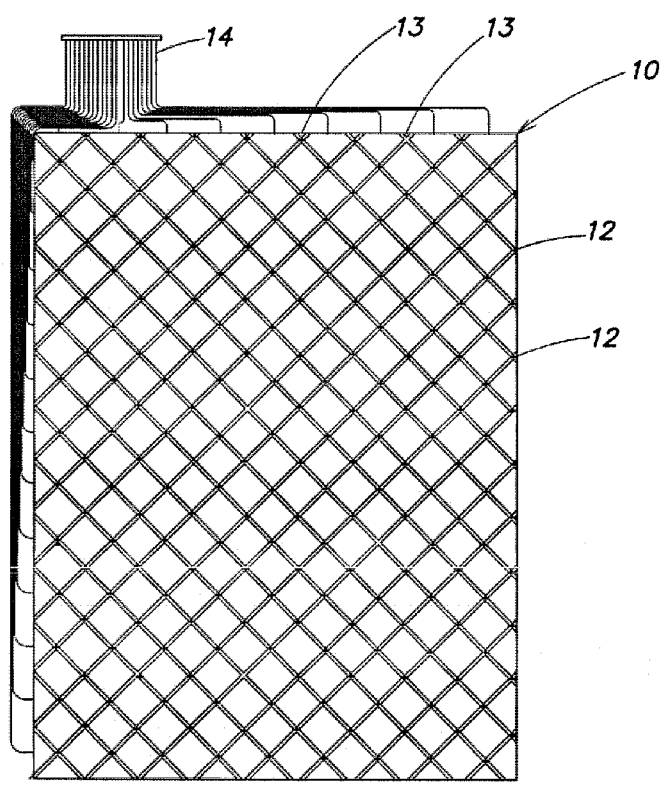
FIG. 1A is a schematic representation of a capacitive touch matrix.

FIG. 1A shows an example of a touch screen having conductive lines 12 and conductive columns 13 of a capacitive touch matrix 10, arranged in a diamond pattern. The capacitive touch matrix 10 may be transparent to allow light from an underlying display unit to pass through the capacitive touch matrix 10 for viewing by a user. A plurality of conductors 14 may be provided for making contact to conductive lines 12 and conductive columns 13. Conductive lines 12 and conductive columns 13 may cover substantially the entire face of the touch screen, enabling touch and proximity detection at substantially any location on the touch screen.

Figure 1B:
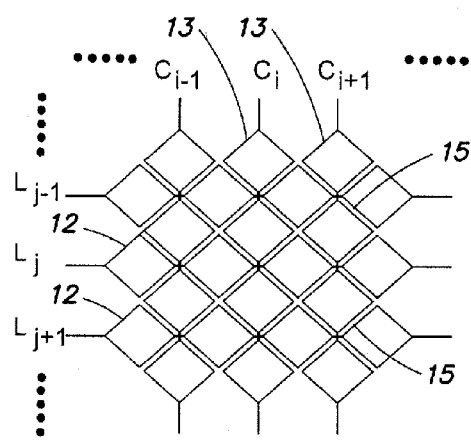
FIG. 1B is an enlarged schematic diagram of a portion of the capacitive touch matrix showing line and column conductors having diamond configurations.

FIG. 1B shows an enlarged portion of the capacitive touch matrix 10 in further detail. The capacitive touch matrix 10 includes a plurality of conductive columns 13 ($C_i$) and a plurality of conductive lines 12 ($L_j$). The conductive columns 13 extend vertically and the conductive lines 12 extend horizontally in FIG. 1B. The conductive lines 12 and the conductive columns 13 cross above or below each other at their intersection points, but are not in contact with one another. Each of the conductive lines 12 and the conductive columns 13 has conductors arranged in a diamond pattern. As a result, the conductive lines 12 and the conductive columns 13 are separated from each other by capacitive gaps 15. The diamond pattern may provide decreased capacitance between conductive lines 12 and conductive columns 13. Capacitive touch matrix 10 may sense an object that modifies the fringing electric field above the capacitive gaps 15 when the object is in contact or in proximity to the screen.

Figure 1C:
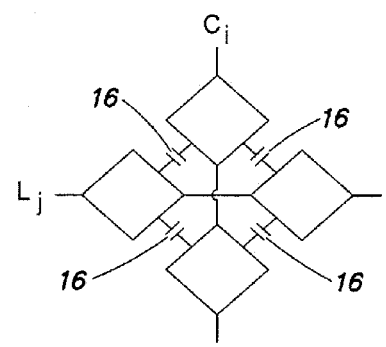
FIG. 1C is a schematic diagram of a single intersection of a line and column, illustrating capacitors between line and column conductors.

FIG. 1C shows that when a conductive column $C_i$ and a conductive line $L_j$ are selected, the total capacitance between column $C_i$ and line $L_j$ is the sum of four capacitances for the capacitors 16 between the four adjacent diamond-shaped regions of column $C_i$ and line $L_j$. The capacitance between column $C_i$ and line $L_j$ can be sensed to determine whether an object is in contact with or in proximity to the touch screen above the region in which the four capacitors 16 are formed. Each conductive line 12 and conductive column 13 of the capacitive touch matrix may be selected in succession to sense the capacitances at each position of the touch screen.

Figure 2:
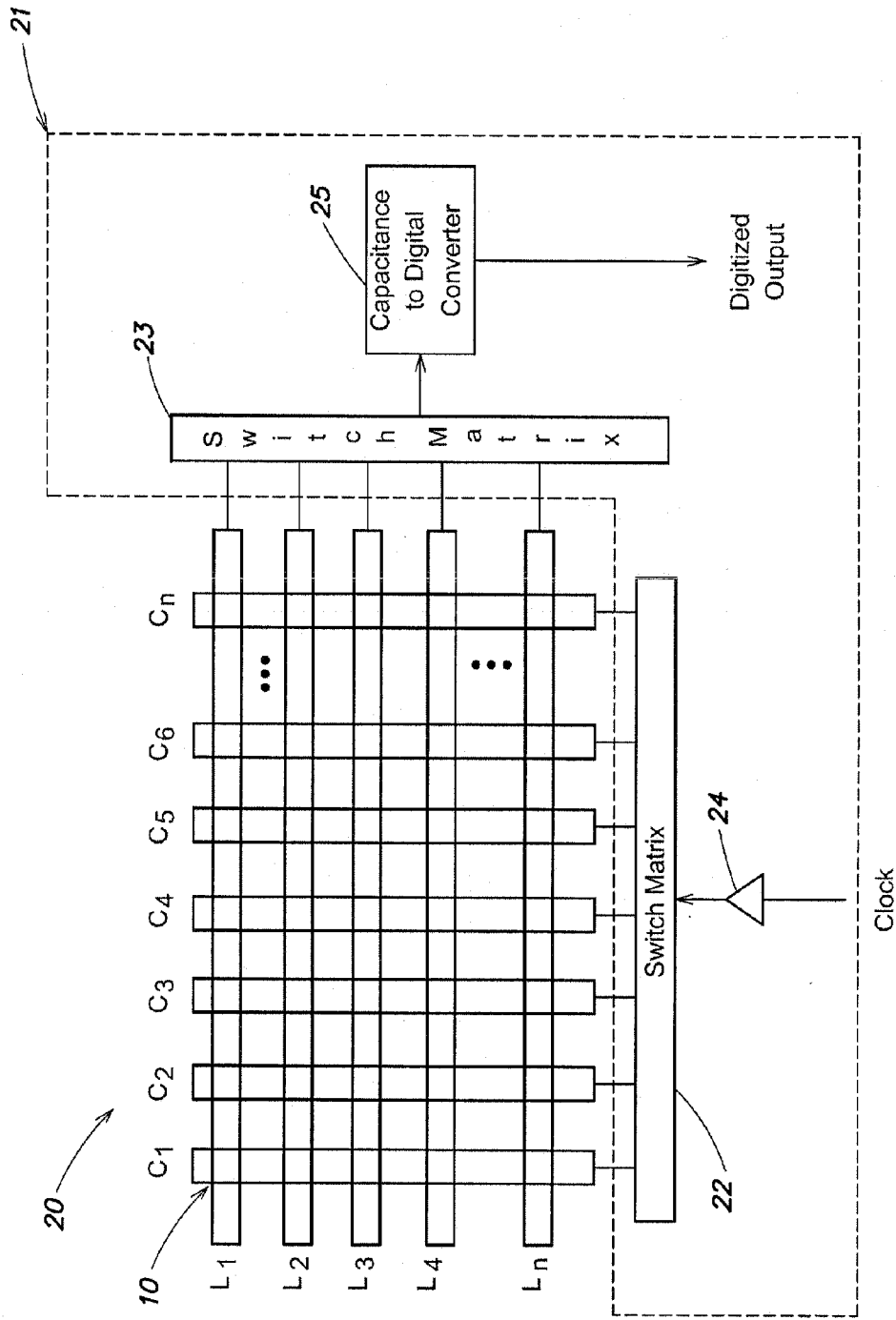
FIG. 2 is a schematic diagram of a touch screen system, illustrating scanning of the elements of the capacitive touch matrix.

FIG. 2 is a block diagram of a touch screen system 20 that includes the capacitive touch matrix 10 and an associated sensing circuit 21. As discussed above, the capacitive touch matrix 10 may have a diamond pattern, which is not shown in FIG. 2 for clarity. The sensing circuit 21 includes a column switch matrix 22 and a line switch matrix 23 for selection of columns and lines of the capacitive touch matrix. The column switch matrix 22 may receive a clock signal from a buffer 24 for timing the switch selection and scanning of the capacitive touch matrix. The line switch matrix 23 may select one or more lines for readout. The charge sensed from the capacitive touch matrix may be converted to a digital value by a capacitance-to-digital converter 25, as discussed below.

The lines and columns of the capacitive touch matrix 10 may be scanned in any suitable manner. For example, the capacitance may be sensed between column $C_1$ and lines $L_1$-$L_n$, then sensed between column $C_2$ and lines $L_1$-$L_n$, and so on until column $C_n$ and lines $L_1$-$L_n$. However, it should be appreciated that this is only an example of a suitable scanning sequence and that any suitable scanning sequence may be used.

At each scanning step, a measurement may be taken from the line/column pair that represents the capacitance between the selected line/column pair. For example, the capacitance between the selected line/column pair may be charged to a determined voltage value. The amount of charge stored depends on the capacitance between the line/column pair. The capacitance between the selected line and column may change when an object is touching the touch screen near the intersection area of the line and column and alters the electric field in this region. To determine whether an object is in the vicinity, the stored charge can be read out and converted into a voltage that is then digitized.

Figure 3:
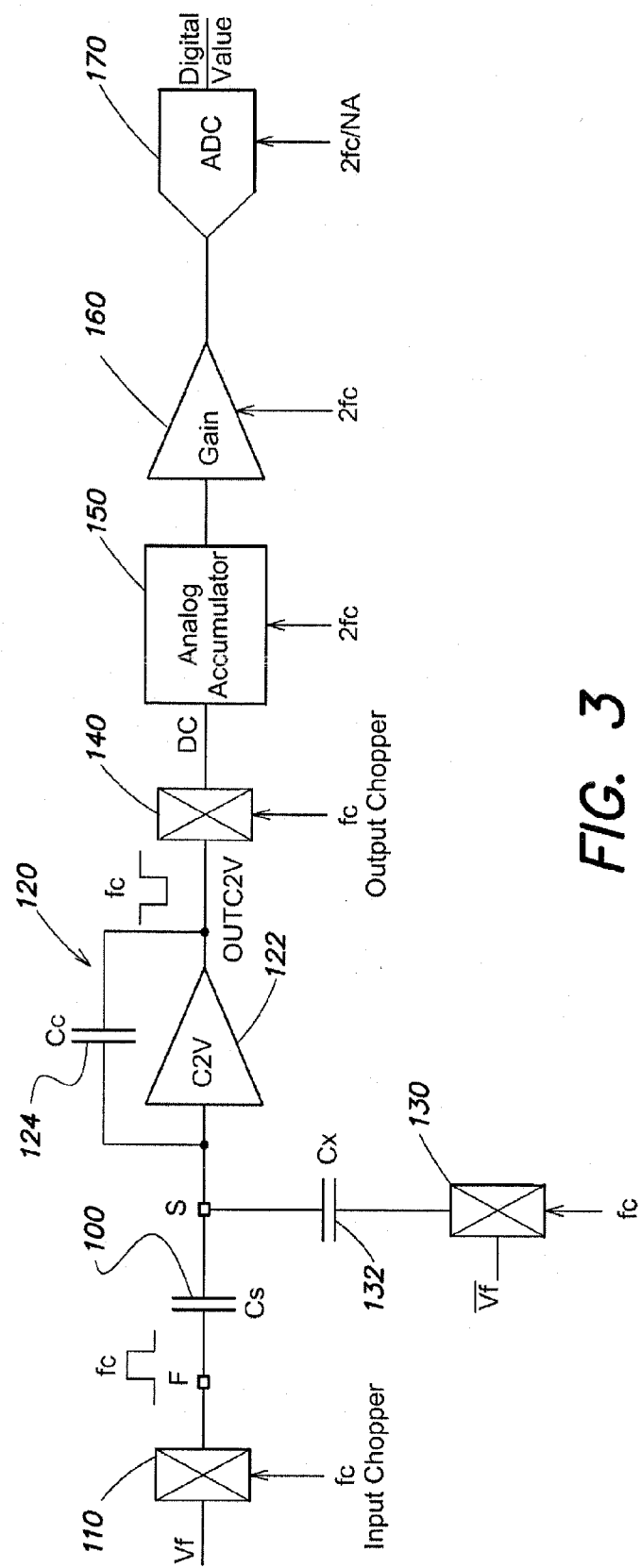
FIG. 3 is a schematic diagram of a single-ended capacitance sensing circuit in accordance with embodiments.

A schematic block diagram of a single-ended capacitance sensing circuit in accordance with embodiments of the invention is shown in FIG. 3. An element of the capacitive touch matrix is represented by matrix element capacitor 100. Capacitor 100 may have a capacitance value of Cs in the absence of a finger or other object and may have a capacitance value of Cs–ΔCs when a finger or other object is present. Capacitance Cs represents the capacitance between a column conductor and a line conductor of the capacitive touch matrix, and capacitance ΔCs represents the change in capacitance produced by a finger or other object touching or in proximity to the intersection between the column conductor and the line conductor of the capacitive touch matrix. Capacitor 100 is shown as having a force node F and a sense node S. A forcing signal is applied to force node F and a sensing signal is read out at sense node S.

A DC voltage Vf is chopped by an input chopper 110 at a modulation frequency fc to provide a squarewave output at frequency fc. The squarewave output of chopper 110 is applied to the force node F, causing capacitor 100 to be charged. A sensing signal at sense node S is applied to a capacitance-to-voltage converter 120 (C2V). Capacitance-to-voltage converter 120 may include an amplifier 122 having an integration capacitor 124 (Cc) in a feedback path between an input and an output of amplifier 122. For a given matrix element capacitor 100, the output OUTC2V of capacitance-to-voltage converter 120 is a squarewave having a voltage given by:

$$VOut = Vcm + Cs/Cc * Vf$$

where Vcm is the common mode voltage of amplifier 122.

The change in matrix element capacitance ΔCs caused by the presence of a finger or other object is relatively small. To cancel the fixed value of the touch screen capacitor 100, an input chopper 130 and a cancellation capacitor 132 (Cx) may be used. The cancellation capacitor 132 is connected to sense node S, and input chopper 130 supplies an inverted squarewave at modulation frequency fc through cancellation capacitor 132 to capacitance-to-voltage converter 120. Ideally, the cancellation capacitor 132 is equal to the matrix element capacitor 100, so that the output of capacitance-to-voltage converter 120 is zero, except when a finger or other object contacts or is in proximity to matrix element capacitor 100. The variation of the output OUTC2V of capacitance-to-voltage converter 120 is given by:

$$\Delta Vout = \Delta Cs/Cc * Vf$$

Thus, the output of capacitance-to-voltage converter 120 is a squarewave having an amplitude that is a function of the change in capacitance produced by the user's finger.

The output OUTC2V of capacitance-to-voltage converter 120 is supplied through an output chopper 140 to an analog accumulator 150. The squarewave output of capacitance-to-voltage converter 120 is chopped by output chopper 140 at modulation frequency fc to produce a DC voltage that is representative of the capacitance being sensed. The output chopper 140 functions as a rectifier of the squarewave at its input.

The analog accumulator 150 accumulates DC voltage values produced by capacitance-to-voltage converter 120 on successive sensing cycles, over an accumulation period having a defined number NA of sensing cycles. The output of output chopper 140 on each cycle is summed with an intermediate accumulated value from previous cycles. By way of example only, where the number NA of accumulation cycles is 128, and the DC output of chopper 140 is 10 mV, the accumulated analog value at the end of the accumulation period is 10 mV×128=1.28 V.

The analog accumulator 150 also preferably performs a low pass filtering function as described below. The low pass filter of analog accumulator 150 filters wideband noise above its cutoff frequency. The low pass filter is discussed below.

The output of analog accumulator 150 is supplied through a gain amplifier 160 to an analog-to-digital converter (ADC) 170. The gain amplifier 160 adjusts the range of the analog accumulator 150 output to match the input range of ADC 170. The output of ADC 170 is a digital value that represents a value of the capacitance being sensed. The analog accumulator 150 and the gain amplifier 160 operate at twice the modulation frequency 2 fc to achieve a Nyquist sampling rate. The ADC 170 operates at a sampling rate of twice the modulation frequency 2 fc divided by the defined number NA of cycles in the accumulation period.

As indicated above, the output OUTC2V of capacitance-to-voltage converter 120 is a squarewave representative of the capacitance being sensed. The output OUTC2V includes amplifier flicker noise and offset, as well as white noise. The amplifier flicker noise and offset are chopped by the output chopper 140, while the signal is rectified by the output chopper 140. The analog accumulator 150 removes the chopped flicker noise and offset, and filters wideband white noise, while accumulating the signal as described above. By accumulating the signal, and especially by filtering the external noise, the analog accumulator 150 maximizes the useful signal at its output and consequently at the input of ADC 170. At the output of the analog accumulator 150, most of the output voltage is the signal itself, thus providing a high SNR. Further, the ADC 170 operates once every NA cycles therefore lowering the requirements for ADC speed and reducing ADC power dissipation. Since the signals maximize the input of the ADC, a lower resolution ADC can be used for a given SNR without introducing any SNR limitation due to quantization error.

As discussed above, the present invention achieves a high SNR due primarily to the fact that the RMS noise at the output of the capacitance-to-voltage converter can be minimized because there is no minimum necessary white noise as in prior architectures. Thus the SNR can be maximized by decreasing intrinsic noise. The single-ended circuit of FIG. 3 in general is sensitive to substrate noise, coupled noise, supply noise, etc. By providing a differential circuit, the intrinsic noise can be very low and the SNR can be further increased. Moreover, the SNR can be improved as the useful signal is doubled. Furthermore, differential chopper structures are relatively straightforward in design.

Figure 4:
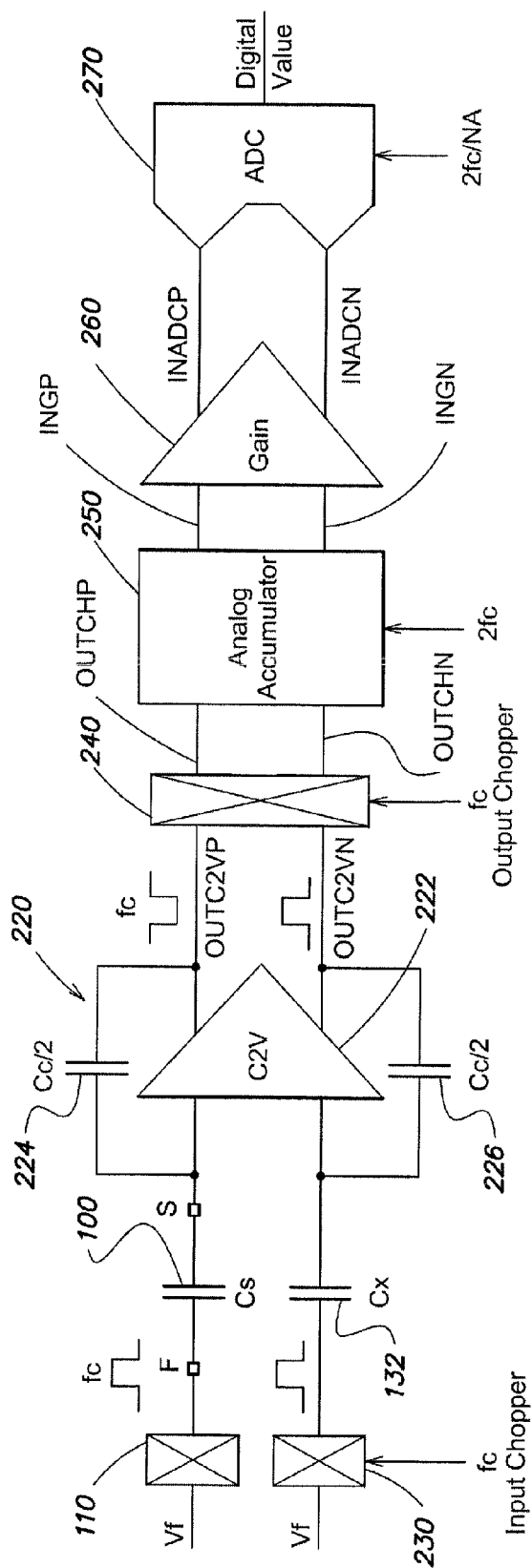
FIG. 4 is a schematic diagram of a differential capacitance sensing circuit in accordance with embodiments.

A schematic block diagram of a fully differential capacitance sensing circuit in accordance with embodiments is shown in FIG. 4. Like elements in FIGS. 3 and 4 have the same reference characters. An element of the capacitive touch matrix is represented by matrix element capacitor 100. A DC voltage Vf is chopped by input chopper 110 at modulation frequency fc to provide a squarewave output at frequency fc. The squarewave output of chopper 110 is applied to force node F, causing capacitor 100 to be charged.

A sensing signal at sense node S is applied to a differential capacitance-to-voltage converter 220. Capacitance-to-voltage converter 220 may include a differential amplifier 222 having an integration capacitor 224 (Cc/2) in a feedback path between an inverting input and a first output of amplifier 222, and an integration capacitor 226 (Cc/2) in a feedback path between a non-inverting input and a second output of differential amplifier 222. The matrix element capacitor 100 is connected via force node F to the inverting input of differential amplifier 222. The cancellation capacitor 132 is connected to the non-inverting input of amplifier 222 and an input chopper 230 supplies a squarewave at modulation frequency fc through cancellation capacitor 132 to capacitance-to-voltage converter 220. The outputs of differential capacitance-to-voltage converter 220 are squarewaves having amplitudes that are a function of the change in capacitance produced by the user's finger.

The outputs OUTC2VP and OUTC2VN of capacitance-to-voltage converter 220 are supplied through a differential output chopper 240 to a differential analog accumulator 250. The squarewave outputs of capacitance-to-voltage converter 220 are chopped by output chopper 240 at modulation frequency fc to produce DC outputs OUTCHP and OUTCHN that are representative of the capacitance being sensed. The output chopper 240 functions as a rectifier of the squarewaves at its inputs.

The analog accumulator 250 accumulates DC voltage values produced by capacitance-to-voltage converter 220 on successive sensing cycles, over an accumulation period having a defined number NA of cycles. The DC outputs of output chopper 240 on each cycle are summed with intermediate accumulated values from previous cycles. After NA cycles, the analog accumulator 250 provides accumulated analog values, INGP and INGN. The analog accumulator 250 preferably performs a low pass filtering function, as described below, to filter wideband noise above its cutoff frequency.

The outputs INGP and INGN of differential analog accumulator 250 are supplied through a differential gain amplifier 260 to a differential ADC 270. The gain amplifier 260 adjusts the range of the analog accumulator 250 output to match the input range of ADC 270. The output of ADC 270 is a digital value that represents a value of the capacitance being sensed. The analog accumulator 250 and the gain amplifier 260 operate at twice the modulation frequency 2 fc, and the ADC 270 operates at twice the modulation frequency 2 fc divided by the defined number NA of cycles in the accumulation period.

Figure 5:
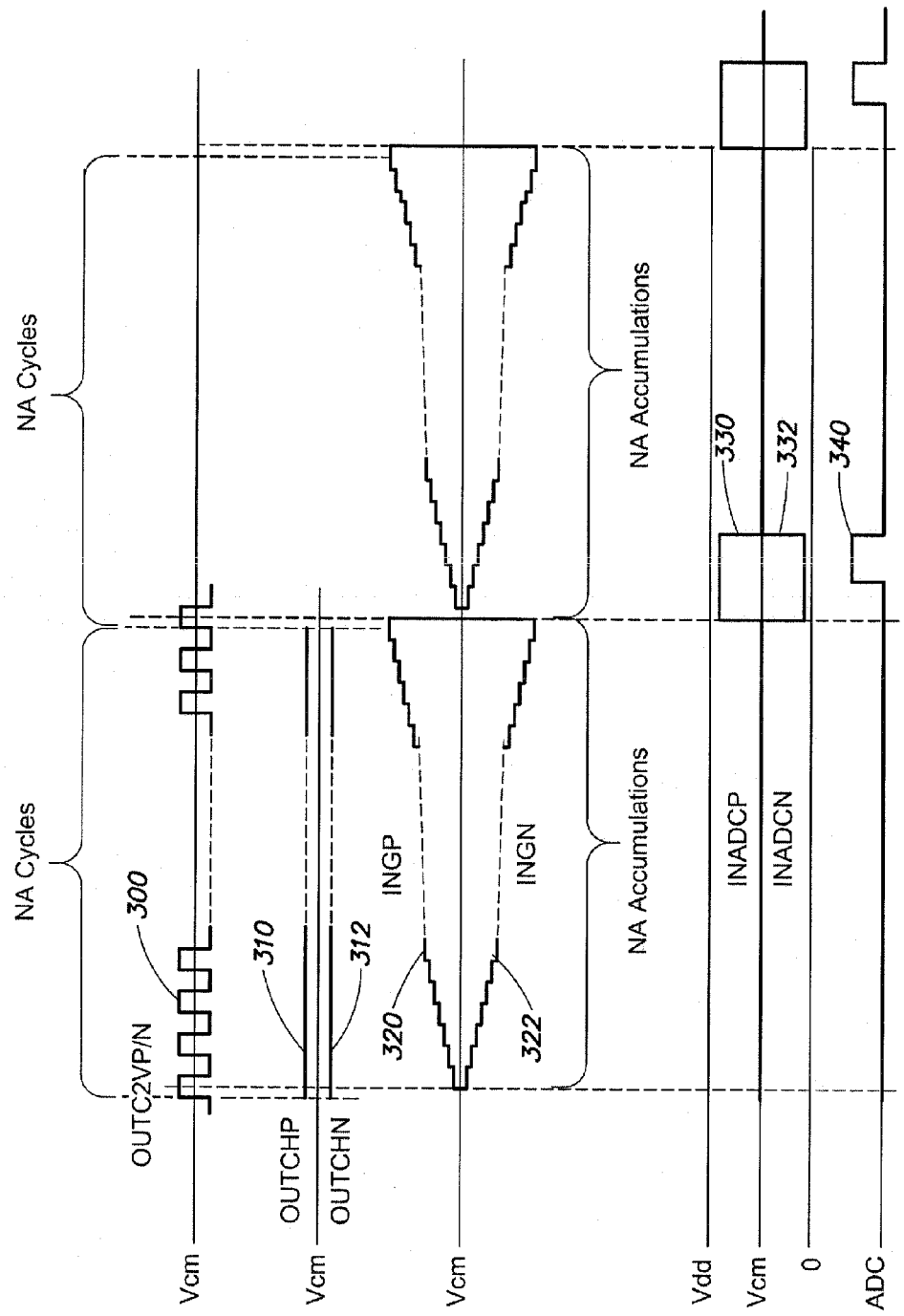
FIG. 5 is a timing diagram that illustrates operation of the differential capacitance sensing circuit of FIG. 4.

A timing diagram that illustrates operation of the differential capacitance sensing circuit of FIG. 4 is shown in FIG. 5. An accumulation period of NA cycles is shown. A waveform 300 represents the outputs OUTC2VP and OUTC2VN of capacitance-to-voltage converter 220. As shown, the outputs are squarewaves at modulation frequency fc and have amplitudes representative of the capacitance being sensed. The squarewaves are referenced to the common mode voltage Vcm. Waveforms 310 and 312 represent the outputs OUTCHP and OUTCHN, respectively, of output chopper 240. As indicated, the outputs of chopper 240 are DC voltages representative of the capacitance being sensed. Waveforms 320 and 322 represent outputs INGP and INGN of analog accumulator 250. As indicated, the accumulated values increase over the accumulation period of NA cycles, based on the value of the capacitance being sensed. At the end of the accumulation period, the accumulated analog value appears at the outputs INADCP and INADCN of gain amplifier 260. The outputs of gain amplifier 260 are indicated by waveforms 330 and 332 respectively. As shown, the gain amplifier 260 holds the accumulated analog value, while analog accumulator 250 begins another accumulation period. During the time when the accumulated analog value appears at the output of gain amplifier 260, as indicated by waveforms 330 and 332, the ADC 270 samples the gain amplifier outputs, as indicated by waveform 340. The ADC 270 thus converts the accumulated analog value, accumulated during the accumulation period of NA cycles, to provide a digital output value representative of the sensed capacitance.

Figure 6A:
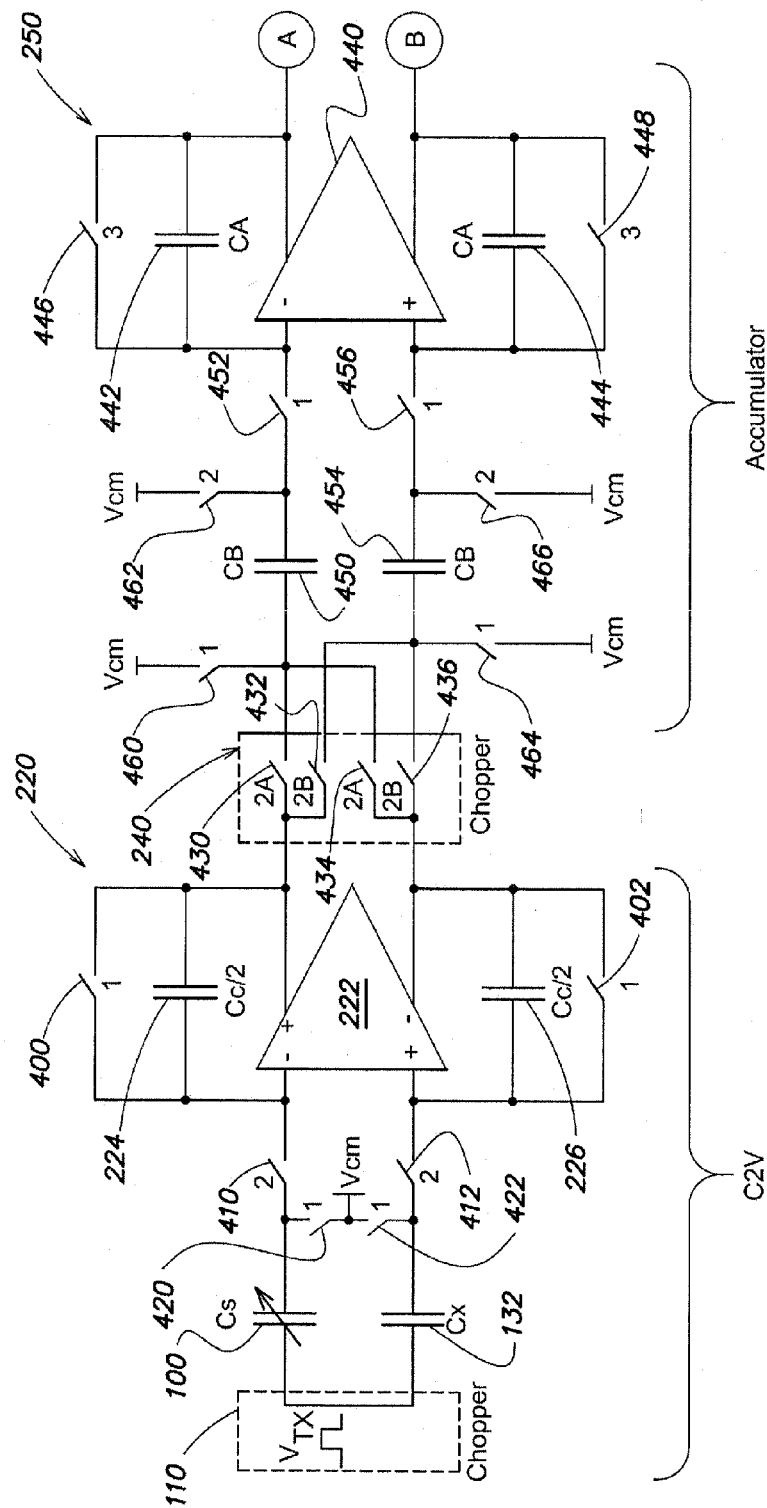
FIGS. 6A and 6B show a schematic diagram that illustrates an implementation of the differential capacitance sensing circuit of FIG. 4.
Figure 6B:
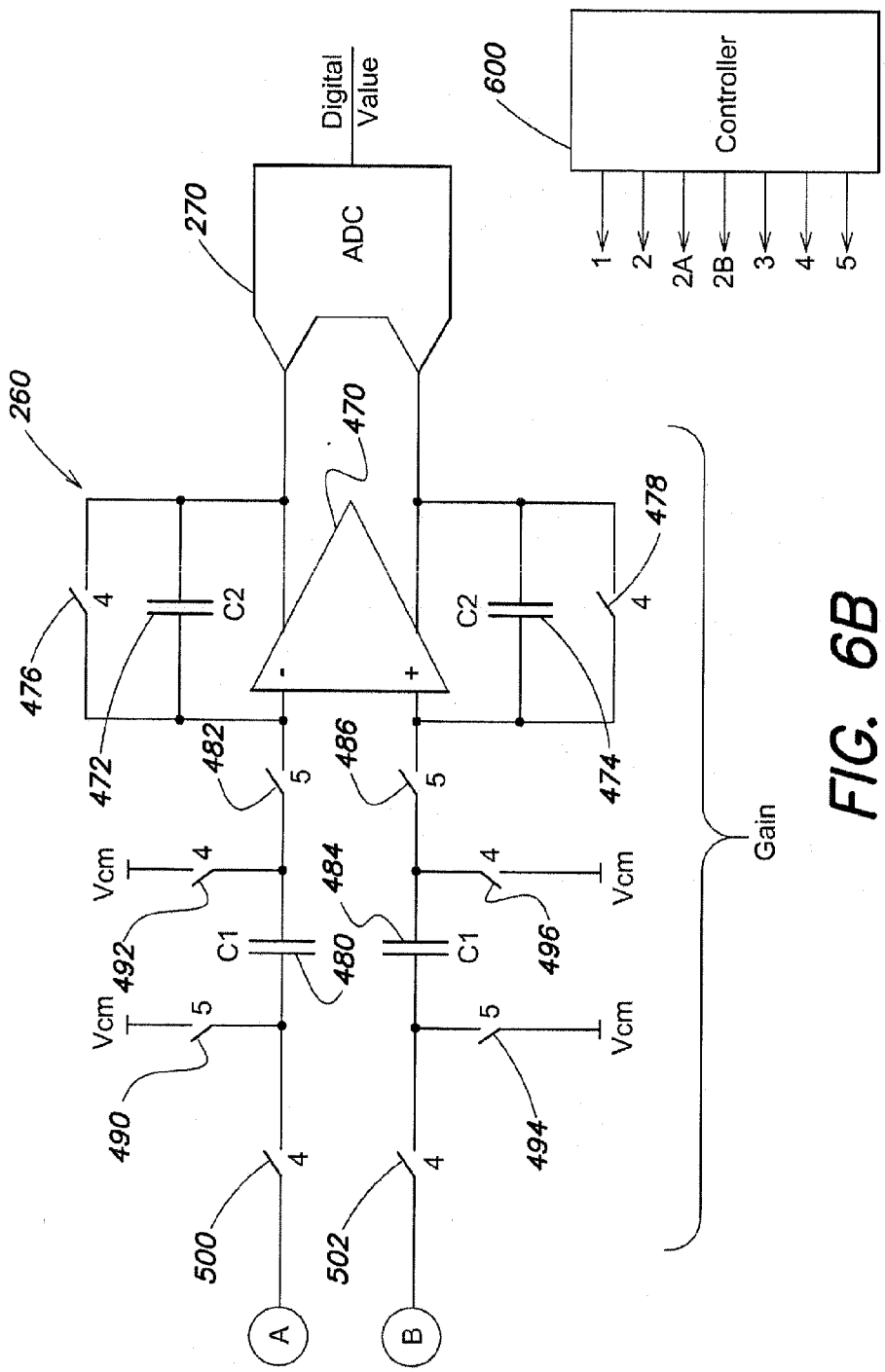

FIGS. 6A and 6B show a schematic diagram that illustrates an implementation of the differential capacitance sensing circuit of FIG. 4. Like elements in FIGS. 4, 6A and 6B have the same reference characters.

As shown, the input chopper can be implemented as single input chopper 110, since the same squarewave forcing signals may be provided to matrix element capacitor 100 and cancellation capacitor 132. In the capacitance-to-voltage converter 220, switches 400 and 402 are connected in parallel with integration capacitors 224 and 226, respectively. A switch 410 is connected between capacitor 100 and an inverting input of amplifier 222. A switch 412 is connected between cancellation capacitor 132 and a non-inverting input of amplifier 222. A switch 420 connects capacitor 100 to common mode voltage Vcm, and a switch 422 connects capacitor 132 to common mode voltage Vcm.

Output chopper 240 is implemented as switches 430, 432, 434 and 436 which connect each differential output of amplifier 222 to each differential input of analog accumulator 250. The switches 430, 432, 434 and 436 are operated by the signals shown in FIG. 7 and described below.

Analog accumulator 250 may include a differential amplifier 440 having a first feedback capacitor 442 (CA) connected between an inverting input and a first output, and a second feedback capacitor 444 (CA) connected between a non-inverting input and a second output. A switch 446 is connected in parallel with capacitor 442, and a switch 448 is connected in parallel with switch 444. Analog accumulator 250 further includes an input capacitor 450 (CB) coupled through a switch 452 to the non-inverting input of differential amplifier 440 and an input capacitor 454 (CB) coupled through a switch 456 to the non-inverting input of differential amplifier 440. Capacitors 450 and 454 may be variable to implement a low pass filter as discussed below. The input capacitors 450 and 454 receive the respective outputs of output chopper 240. The two terminals of input capacitor 450 are connected by respective switches 460 and 462 to the common mode voltage Vcm. The two terminals of the input capacitor 454 are connected by respective switches 464 and 466 to the common mode voltage Vcm. The switches shown in FIGS. 6A and 6B and described herein may be implemented as transistors controlled by timing signals as discussed below.

The gain amplifier 260 includes a differential amplifier 470 having a first feedback capacitor 472 (C2) connected between a non-inverting input and a first output, and a second feedback capacitor 474 (C2) connected between a non-inverting input and a second output of differential amplifier 470. A switch 476 is connected in parallel with feedback capacitor 472, and a switch 478 is connected in parallel with feedback capacitor 474. Gain amplifier 260 further includes a switch 500, a first input capacitor 480 (C1) and a switch 482 connected in series between the first output of differential amplifier 440 and the inverting input of differential amplifier 470, and a switch 502, a second input capacitor 484 (C2) and a switch 486 connected in series between the second output of differential amplifier 440 and the non-inverting input of differential amplifier 470. The two terminals of input capacitor 480 are respectively coupled through switches 490 and 492 to the common mode voltage Vcm, and the two terminals of input capacitor 484 are respectively coupled through switches 494 and 496 to the common mode voltage Vcm. The outputs of differential amplifier 470 are connected to the respective inputs of ADC 270.

Figure 7:
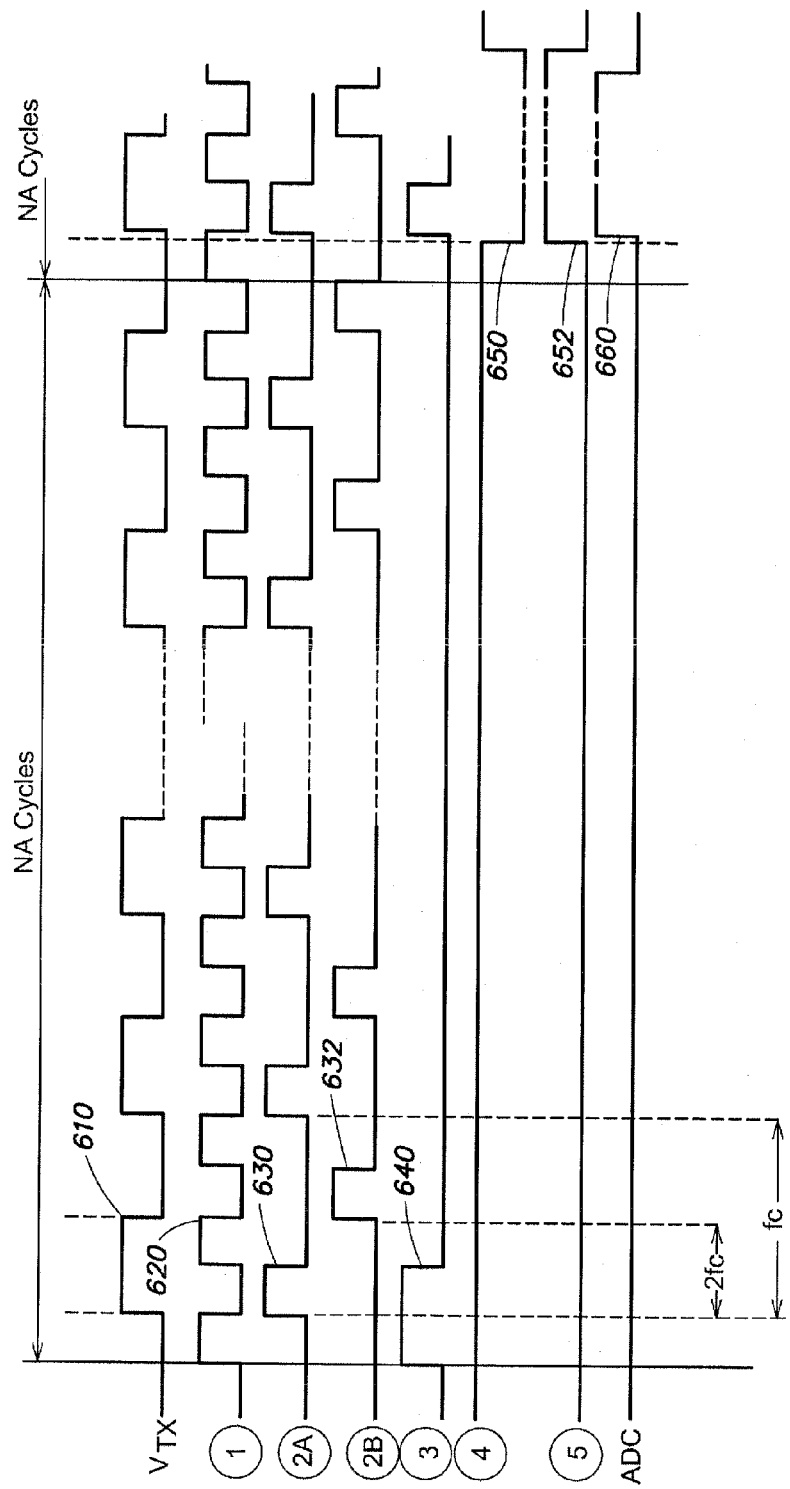
FIG. 7 is a timing diagram that illustrates operation of the differential capacitance sensing circuit of FIGS. 6A and 6B.

A timing diagram that illustrates waveforms associated with operation of the differential capacitance sensing circuit of FIGS. 6A and 6B is shown in FIG. 7. The timing signals for controlling the capacitance sensing circuit may be generated by a controller 600, which is programmed to generate synchronized timing signals 1, 2, 2A, 2B, 3, 4 and 5 for controlling the switches in the capacitance sensing circuit. The switches may be implemented, for example, by transistors, and the on-off states of the transistors are controlled by controller 600. The control signal for each switch in FIGS. 6A and 6B is indicated next to the switch. As stated below, timing signal 2 is the logical OR of timing signals 2A and 2B.

Referring to FIG. 7, a waveform 610 at modulation frequency fc represents the squarewave applied by input chopper 110 to matrix element capacitor 100 and cancellation capacitor 132. A waveform 620 (timing signal 1) at twice the modulation frequency 2 fc is applied to switches 400, 402, 420, 422, 452, 456, 460 and 464. A waveform 630 (timing signal 2A) at twice the modulation frequency 2 fc is applied to switches 430 and 436 of output chopper 240. A waveform 632 (timing signal 2B) at twice the modulation frequency 2 fc is applied to switches 432 and 434 of output chopper 240. A waveform (not shown) that is a logical "OR" of waveform 630 and waveform 632 (620+632), at twice the modulation frequency 2 fc, is applied to switches 410, 412, 462 and 466. A waveform 640 (timing signal 3) at the frequency of the accumulation period of NA cycles is applied to switches 446 and 448. A waveform 650 (timing signal 4) at the frequency of the accumulation period of NA cycles is applied to switches 476, 478, 492, 496, 500 and 502. A waveform 652 (timing signal 5) at the frequency of the accumulation period of NA cycles is applied to switches 482, 486, 490 and 494. A waveform 660 at the frequency of the accumulation period of NA cycles represents the times at which the ADC 70 samples the outputs of gain amplifier 260.

A fully differential capacitance sensing circuit is shown in FIGS. 4-7 and described above. The fully differential capacitance-to-voltage converter may require input common mode feedback control, which may induce noise at the output of the capacitance-to-voltage converter when the two input lines from capacitor 100 and capacitor 132 are not properly balanced in terms of impedance. Therefore, an alternative pseudo differential capacitance sensing circuit is provided, wherein the input is single-ended with the amplifier referenced to the common mode voltage Vcm, while the output is differential. A fully differential operational amplifier is used in a single-ended configuration. The negative output of the operational amplifier, despite not being fed back to the non-inverting input, tracks the positive output of the operational amplifier. The tracking is ensured by output common mode feedback control circuitry embedded in the fully differential operational amplifier. Alternatively, the pseudo-differential stage can be implemented by making use of two differential to single-ended amplifiers.

Figure 8:
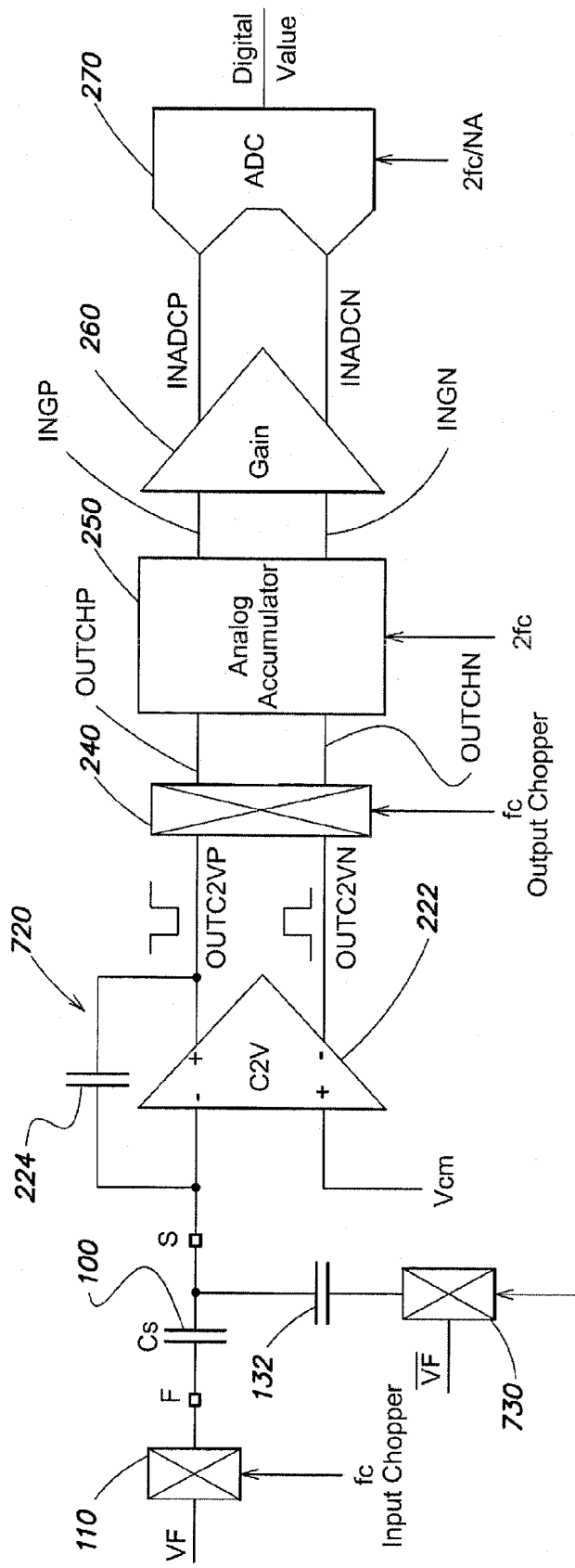
FIG. 8 is a schematic diagram of a pseudo differential capacitance sensing circuit in accordance with embodiments.

FIG. 8 is a schematic block diagram of a pseudo differential capacitance sensing circuit in accordance with embodiments of the invention. Like elements in FIGS. 4 and 8 have the same reference characters. The pseudo differential sensing circuit of FIG. 8 differs from the fully differential sensing circuit of FIG. 4 primarily with respect to inputs to the capacitance-to-voltage converter. As shown, a capacitance-to-voltage converter 720 includes a differential operational amplifier 222 having integration capacitor 224 connected between the inverting input of amplifier 222 and the first output of amplifier 222. A second integration capacitor is not used in the embodiment of FIG. 8. A DC voltage Vf is chopped by input chopper 110 at modulation frequency fc to provide a square-wave output at frequency fc. The squarewave output of chopper 110 is applied to force node F as a forcing signal, causing capacitor 100 to be charged. A sensing signal at sense node S is applied to the inverting input of differential amplifier 222. The cancellation capacitor 132 is connected to sense node S, and a cancellation chopper 730 supplies an inverted square-wave at modulation frequency fc through cancellation capacitor 132 to the inverting input of differential amplifier 222. The non-inverting input of differential amplifier 222 is connected to common mode voltage Vcm. The outputs OUTC2VP and OUTC2VN of differential amplifier 222 are connected to output chopper 240 as in the embodiment of FIG. 4.

The analog accumulators 150 (FIG. 3) and 250 (FIGS. 4, 6 and 8) may be implemented as switched capacitor filters and accumulators. During each cycle of the accumulation period, the input data is sampled by capacitors 450 and 454 (CB) and is transferred and accumulated to capacitors 442 and 444 (CA) (FIG. 6). Where the capacitor CB has a fixed value, the filter provides rectangle filtering, as every sample data has the same weight. In order to implement a triangular filter, capacitor CB is varied on every cycle of the accumulation period. Thus, capacitors 450 and 454 (CB) of accumulator 250 may be implemented as variable capacitors. Depending on the way the capacitors CB are varied from cycle to cycle, different filter characteristics, such as triangular, Gaussian, etc., can be implemented. In addition, the output capacitors 442 and 444 (CA) can be implemented as variable capacitors in order to compensate for variations of the input signal to the accumulator, variations that can originate from the first stage settings (Vf, Cc, Cs, dCs).

In some embodiments, the variable capacitors 450 and 454 (CB) can be implemented as a number of branches connected in parallel, wherein each branch includes a capacitor and a switch in series. By programming the switches that are open and closed, different capacitance values can be obtained. Thus, by controlling individual switches, different weighting can be applied to the accumulator, so that different filter profiles can be achieved. Examples of such filter profiles includes rectangular window filtering, triangular window filtering, hamming window filtering, etc.

In some embodiments, triangular window filtering is utilized. For a triangular window with an accumulation period of 128 cycles, the capacitance values in picofarads for each cycle are 0.05, 0.15, 0.25, 0.35, . . . 6.25, 6.35, 6.35, 6.25, 6.15, . . . 0.25, 0.15 and 0.05. The total capacitance sum is 409.6 picofarads for an accumulation period of 128 cycles. For a triangular window with an accumulation period of 64 cycles, the capacitance values in picofarads for each cycle are 0.1, 0.3, 0.5, 0.7, 0.9, . . . 5.9, 6.1, 6.3, 6.3, 6.1, 5.9, . . . 0.5, 0.3 and 0.1. The total capacitance sum is 204.8 picofarads for an accumulation period of 64 cycles. For a triangular window with an accumulation period of 32 cycles, the capacitance value in picofarads for each cycle are 0.2, 0.6, 1.0, 1.4, . . . 5.4, 5.8, 6.2, 6.2, 5.8, 5.4, . . . 1.4, 1.0, 0.6 and 0.2. The total capacitance sum is 102.4 picofarads for an accumulation period of 32 cycles. By setting the capacitance in this way, the gain ratio can be maintained for accumulation periods of 128 cycles, 64 cycles and 32 cycles.

After the accumulation period of NA cycles, the signal output of the analog accumulator can be sampled and held by the gain amplifier 160, 260. The analog accumulator can then start a new accumulation period of NA cycles, while the previous accumulated analog value remains available for analog-to-digital conversion. In this way, one ADC can be used to convert several channels. The ADC input is successively time multiplexed to each of the gain amplifier outputs.

As indicated above, the accumulation period of NA cycles can be varied. For example, accumulation periods of 32 cycles, 64 cycles or 128 cycles can be used depending on the desired speed and noise rejection. When a smaller number of cycles is used in the accumulation period, the filtering effect is reduced, but faster operation is achieved. Also, the gain of the analog accumulator is not the same for different accumulation periods. In particular, a 1:4 gain ratio occurs between a 32 cycle accumulation period and a 128 cycle accumulation period. Preferably, the overall amplification chain has a constant gain for different accumulation period settings. In a touch screen, the signal may be so small that a change in setting of the accumulation period may be detected as a user touch on the touch screen. As indicated above, the output capacitors CA could be utilized to compensate for gain variations due to NA variations. However, this is not the preferred method and gain compensation due to accumulation period changes are performed independently of the accumulator input signal in the gain amplifier 160, 260. The output capacitors C2 of the gain amplifier 160, 260 may be variable to perform gain adjustment. Typically 3 values are used in a 1×:2×:4× ratio selected to compensate for the 128×:64×:32× accumulations. Further, capacitors C1 may be variable to provide additional gain adjustment of the overall chain. Accordingly, the overall circuit may be adjusted to provide constant gain for different accumulation period settings and first input stage settings.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:
1. A capacitance sensing circuit comprising:
a differential capacitance-to-voltage converter configured to receive a first signal from a sense capacitor and a second signal from a cancellation capacitor, the differential capacitance-to-voltage converter further configured to provide a differential output signal representative of a change in capacitance at the sense capacitor;
an output chopper configured to convert the differential output signal of the differential capacitance-to-voltage converter to a sensed voltage representative of the change in capacitance;
an analog accumulator configured to accumulate sensed voltages during an accumulation period of a number of sensing cycles and to provide an accumulated analog value;
an amplifier configured to amplify the accumulated analog value; and
an analog-to-digital converter configured to convert the amplified accumulated analog value to a digital value representative of the change in capacitance.

2. A capacitance sensing circuit as defined in claim 1, wherein the analog accumulator includes a filter having a changeable frequency response to filter wideband noise.

3. A capacitance sensing circuit as defined in claim 2, wherein the changeable frequency response of the filter is variable during the accumulation period.

4. A capacitance sensing circuit as defined in claim 1, wherein the differential capacitance-to-voltage converter comprises a differential amplifier and wherein the first signal from the sense capacitor and second signal from the cancellation capacitor are received at a same input of the differential amplifier.

5. A capacitance sensing circuit as defined in claim 1, wherein the differential capacitance-to-voltage converter comprises a differential amplifier and wherein the first signal from the sense capacitor is received at a first input of the differential amplifier and the second signal from the cancellation capacitor is received at a second input of the differential amplifier.

6. A capacitance sensing circuit as defined in claim 1, wherein the amplifier is configured to adjust a range of the accumulated analog value to a range compatible with an input to the analog-to-digital converter.

7. A capacitance sensing circuit as defined in claim 6, wherein the amplifier is configured to hold the accumulated analog value during a subsequent accumulation period.

8. A capacitance sensing circuit as defined in claim 7, wherein the number of sensing cycles in the accumulation period is selectable.

9. A capacitance sensing circuit as defined in claim 8, wherein the amplifier is adjusted to provide a constant overall gain for different accumulation periods.

10. A capacitance sensing circuit as defined in claim 1, further comprising a controller configured to provide timing signals to the differential capacitance-to-voltage converter, the output chopper, the analog accumulator and the analog-to-digital converter.

11. A capacitance sensing circuit as defined in claim 1, further comprising an input chopper configured to convert a DC voltage to an AC signal applied to the sense capacitor and the cancellation capacitor.

12. A capacitance sensing circuit as defined in claim 1, wherein the sense capacitor is an element of a capacitive touch screen.

13. A capacitance sensing circuit comprising:
a capacitance-to-voltage converter including a differential amplifier having a first input configured to receive a common mode voltage and a second input configured to receive a signal which sums a sense signal from a sense capacitor and a cancellation signal from a cancellation capacitor, said differential amplifier further configured to provide an output signal representative of a change in capacitance of the sense capacitor;
a circuit configured to convert the output signal of the capacitance-to-voltage converter to a sensed voltage representative of the change in capacitance;
an analog accumulator and filter configured to accumulate sensed voltages during an accumulation period of a number of sensing cycles and to filter the sensed voltages, wherein the analog accumulator and filter provides an accumulated analog value;
an amplifier configured to amplify the accumulated analog value; and
an analog-to-digital converter configured to convert the amplified accumulated analog value to a digital value representative of the change in capacitance.

14. A capacitance sensing circuit as defined in claim 13, wherein the analog accumulator and filter includes a programmable frequency response to filter wideband noise.

15. A capacitance sensing circuit as defined in claim 14, wherein parameters of the programmable frequency response are variable during the accumulation period.

16. A capacitance sensing circuit as defined in claim 14, wherein the programmable frequency response is provided by one of a low pass filter or a triangular analog FIR filter.

17. A capacitance sensing circuit as defined in claim 13, wherein a range of the accumulated analog value is adjustable to be compatible with a range of an input to the analog-to-digital converter.

18. A capacitance sensing circuit as defined in claim 13, wherein the amplifier is configured to hold the accumulated analog value during a subsequent accumulation period.

19. A capacitance sensing circuit as defined in claim 13, wherein the number of sensing cycles in the accumulation period is selectable.

20. A capacitance sensing circuit as defined in claim 13, further comprising an input chopper configured to convert a DC voltage to a first AC signal applied to the sense capacitor and a second AC signal, which is an inversion of the first AC signal, applied to the cancellation capacitor.

21. A capacitance sensing circuit as defined in claim 13, wherein the sense capacitor is an element of a capacitive touch screen.

22. A capacitance sensing circuit comprising:
a capacitance-to-voltage converter including a differential amplifier having a first input configured to receive a sense signal from a sense capacitor and a second input configured to receive a cancellation signal from a cancellation capacitor, said differential amplifier further configured to provide an output signal representative of a change in capacitance of the sense capacitor;
a circuit configured to convert the output signal of the capacitance-to-voltage converter to a sensed voltage representative of the change in capacitance;
an analog accumulator and filter configured to accumulate sensed voltages during an accumulation period of a number of sensing cycles and to filter the sensed voltages, wherein the analog accumulator and filter provides an accumulated analog value;
an amplifier configured to amplify the accumulated analog value; and
an analog-to-digital converter configured to convert the amplified accumulated analog value to a digital value representative of the change in capacitance.

23. A capacitance sensing circuit as defined in claim 22, wherein the analog accumulator and filter includes a programmable frequency response to filter wideband noise.

24. A capacitance sensing circuit as defined in claim 23, wherein parameters of the programmable frequency response are variable during the accumulation period.

25. A capacitance sensing circuit as defined in claim 23, wherein the programmable frequency response is provided by one of a low pass filter or a triangular analog FIR filter.

26. A capacitance sensing circuit as defined in claim 22, wherein a range of the accumulated analog value is adjustable to be compatible with a range of an input to the analog-to-digital converter.

27. A capacitance sensing circuit as defined in claim 23, wherein the amplifier is configured to hold the accumulated analog value during a subsequent accumulation period.

28. A capacitance sensing circuit as defined in claim 24, wherein the number of sensing cycles in the accumulation period is selectable.

29. A capacitance sensing circuit as defined in claim 25, further comprising an input chopper configured to convert a DC voltage to a first AC signal applied to the sense capacitor and a second AC signal applied to the cancellation capacitor.

30. A capacitance sensing circuit as defined in claim 26, wherein the sense capacitor is an element of a capacitive touch screen.

* * * * *